United States Patent
Min et al.

(10) Patent No.: US 7,239,260 B2
(45) Date of Patent: Jul. 3, 2007

(54) ANALOG-TO-DIGITAL INTERFACING DEVICE AND METHOD OF ANALOG-TO-DIGITAL INTERFACING

(75) Inventors: Byung-ho Min, Suwon-si (KR); Hyun-woo Park, Suwon-si (KR); Keun-cheol Hong, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/447,028

(22) Filed: Jun. 6, 2006

(65) Prior Publication Data

US 2006/0227029 A1  Oct. 12, 2006

Related U.S. Application Data

(63) Continuation of application No. 10/887,294, filed on Jul. 9, 2004, now Pat. No. 7,132,971.

(30) Foreign Application Priority Data

Jul. 10, 2003  (KR) ............ 10-2003-46878
Jan. 8, 2004   (KR) ............ 10-2004-01105

(51) Int. Cl.
 *H03M 1/12* (2006.01)
(52) U.S. Cl. ........................................ 341/155
(58) Field of Classification Search ........ 341/141, 341/155, 159, 163
See application file for complete search history.

(56) References Cited

U.S. PATENT DOCUMENTS

| | | | |
|---|---|---|---|
| 4,050,062 A | 9/1977 | Crocker et al. | |
| 4,654,632 A | 3/1987 | Yoshida et al. | |
| 5,212,483 A * | 5/1993 | Wakimoto | 341/141 |
| 5,463,395 A | 10/1995 | Sawai | |
| 5,506,700 A | 4/1996 | Nishimura | |
| 6,323,792 B1 | 11/2001 | Regier | |
| 6,433,716 B2 | 8/2002 | Arai et al. | |
| 6,486,809 B1 | 11/2002 | Figoli | |
| 6,653,963 B1 * | 11/2003 | Barrenscheen et al. | 341/155 |
| 6,697,006 B1 | 2/2004 | McCartney et al. | |
| 6,754,610 B2 | 6/2004 | Dudler et al. | |
| 6,809,674 B1 * | 10/2004 | Ramsden | 341/155 |

FOREIGN PATENT DOCUMENTS

| | | |
|---|---|---|
| JP | 63-178622 | 7/1988 |
| JP | 9-252251 A | 9/1997 |
| WO | WO 02/15404 A2 | 2/2002 |

OTHER PUBLICATIONS

United Kingdom Office Action dated Oct. 26, 2004.
British Examination Report dated Mar. 15, 2006.
Great Britain Search Report dated Feb. 13, 2007.

* cited by examiner

*Primary Examiner*—Brian Young
(74) *Attorney, Agent, or Firm*—Harness, Dickey & Pierce, PLC

(57) ABSTRACT

In the analog-to-digital interfacing device, an input selector receives a plurality of analog signals and selectively outputs one of the analog signals based on a plurality of clock signals. An analog-to-digital converter converts the analog signals output from the selector to digital signals.

22 Claims, 6 Drawing Sheets

ANALOG-TO-DIGITAL INTERFACING DEVICE AND METHOD OF ANALOG-TO-DIGITAL INTERFACING

CROSS-REFERENCE TO RELATED APPLICATIONS

This is a continuation of, and claims priority under 35 U.S.C. § 120 to, U.S. application Ser. No. 10/887,294, filed Jul. 9, 2004, the entire contents of which are hereby incorporated by reference.

BACKGROUND OF THE INVENTION

1. Field of the Invention

The present invention relates to a semiconductor integrated circuit, and more particularly, to a multi-port interfacing device and method.

2. Description of the Related Art

Generally, a semiconductor chip includes analog-to-digital converters to receive an external analog input signal and convert the analog input signal to a digital output signal. In a multi-port interfacing device, each port that is connected to a corresponding external device includes an analog-to-digital converter to amplify and sample an external analog input signal and convert it to a digital output signal. However, since one integrated circuit includes a plurality of analog-to-digital converters, a large area of the integrated circuit is occupied by the analog-to-digital converters. Thus the fabrication cost increases and the yield of chips decreases.

SUMMARY OF THE INVENTION

The present invention provides an analog-to-digital interfacing device that significantly reduces the number of analog-to-digital converts. For example, the present invention provides example embodiments for multi-port interfacing using only a single analog-to-digital converter.

In one example embodiment, the interfacing device includes an input selector receiving a plurality of analog signals and selectively outputting one of the analog signals based on a plurality of clock signals. An analog-to-digital converter converts the analog signals output from the selector to digital signals.

The input selector may, for example, include a plurality of logic controlled gates, with each logic controlled gate receiving one of the plurality of analog signals and selectively outputting the received analog signal to the analog-to-digital converter based on the plurality of clock signals. Here, the analog signals may be supplied to respective ports included in the interfacing device.

The interfacing device may further include a plurality of registers and an output selector, which receives each digital signal output from the analog-to-digital converter and selectively routes the digital signal to one of the plurality of registers based on the clock signals.

The clock signals in the above described example embodiment may be generated by a clock signal generator. For example, the clock signal generator may divide an external clock signal by multiples of 2 to generate the plurality of clock signals. As another example, the clock signal generator gates pulses of an external clock signal to generate the plurality of clock signals. Here, the plurality of clock signals may be represented by a m-bit digital word.

According to an exemplary embodiment of analog-to-digital interfacing, according to the present invention, one of a received plurality of analog signals are selectively converted to a digital signal based on clock signals. Furthermore, this example embodiment may further include selectively routing the digital signal to one of a plurality of registers based on the clock signals.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

Figure 1:
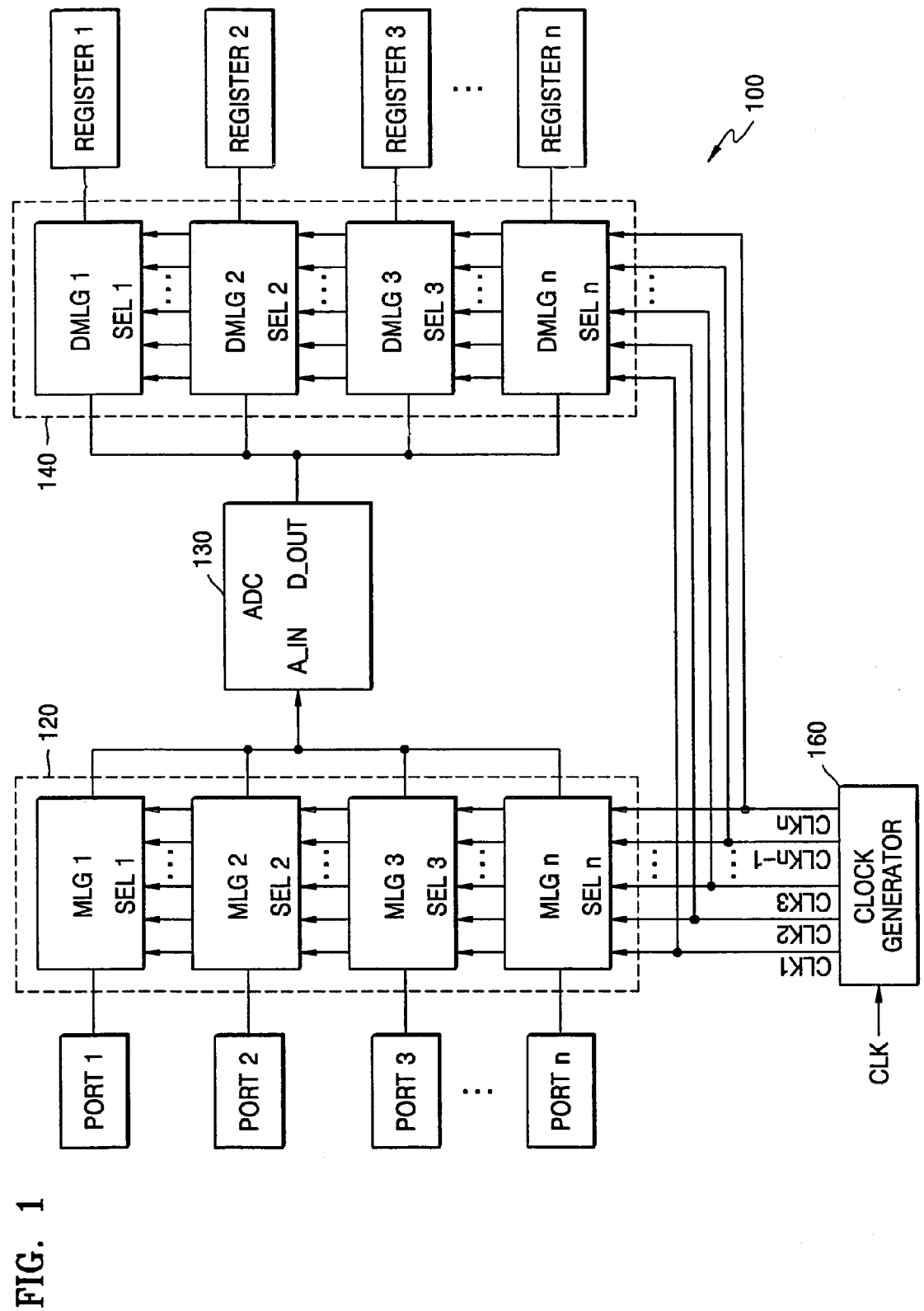
FIG. 1 illustrates a multi-port interfacing device according an embodiment of the present invention.

The present invention will now be described more fully with reference to the accompanying drawings, in which exemplary embodiments of the invention are shown. The same reference numerals are used to denote the same elements throughout the drawings.

FIG. 1 illustrates a multi-port interfacing device according to a first embodiment of the present invention. Referring to FIG. 1, a multi-port interfacing device 100 includes a plurality of ports Port 1, Port 2, . . . , Port n, a multiplexer 120, an analog-to-digital converter 130, a de-multiplexer 140, a plurality of registers Register 1, Register 2, . . . Register n, and a clock generator 160. The multiplexer 120 includes first logic controlled gates MLG1, MLG2, . . . , MLGn. The de-multiplexer includes second logic controlled gates DMLG1, DMLG2, . . . , DMLGn.

The ports Port 1, Port 2, . . . , Port n are connected to the first logic controlled gates MLG1, MLG2, . . . , MLGn, respectively. The first logic controlled gates MLG1, MLG2, . . . , MLGn select one of the ports Port 1, Port 2, . . . , Port n in response to each of the internally generated first through nth selection signals SEL1, SEL2, SEL3, . . . , and SELn, and the multiplexer 120 selectively transmits an analog input signal A_IN from the selected one of the ports Port 1, Port 2, . . . , Port n to the analog-to-digital converter 130.

The analog-to-digital converter 130 converts the analog input signal A_IN to an m-bit digital output signal D_OUT. Then, the analog-to-digital converter 130 outputs the m-bit digital output signal D_OUT to the second logic controlled gates DMLG1, DMLG2, . . . , DMLGn of the demultiplexer

140. The second logic controlled gates DMLG1, DMLG2, . . . , DMLGn transmit the digital output signal D_OUT to a selected one of the registers Register 1, Register 2, . . . Register n in response to the first through nth selection signals SEL1, SEL2, SEL3, . . . , and SELn. The respective one of the plurality of registers Register 1, Register 2, . . . Register n stores the m-bit digital output signal D_OUT.

The clock generator 160 receives an external clock signal CLK, divides the external clock signal CLK, and generates predetermined first through nth internal clock signals CLK1, CLK2, CLK3, . . . , and CLKn. The first logic controlled gates MLG1, MLG2, . . . , MLGn and the second logic controlled gates DMLG1, DMLG2, . . . , DMLGn receive the internal clock signals CLK1, CLK2, CLK3, . . . , and CLKn from the clock generator 160 and generate the first through nth selection signals SEL1, SEL2, SEL3, . . . , and SELn, respectively.

Figure 2:
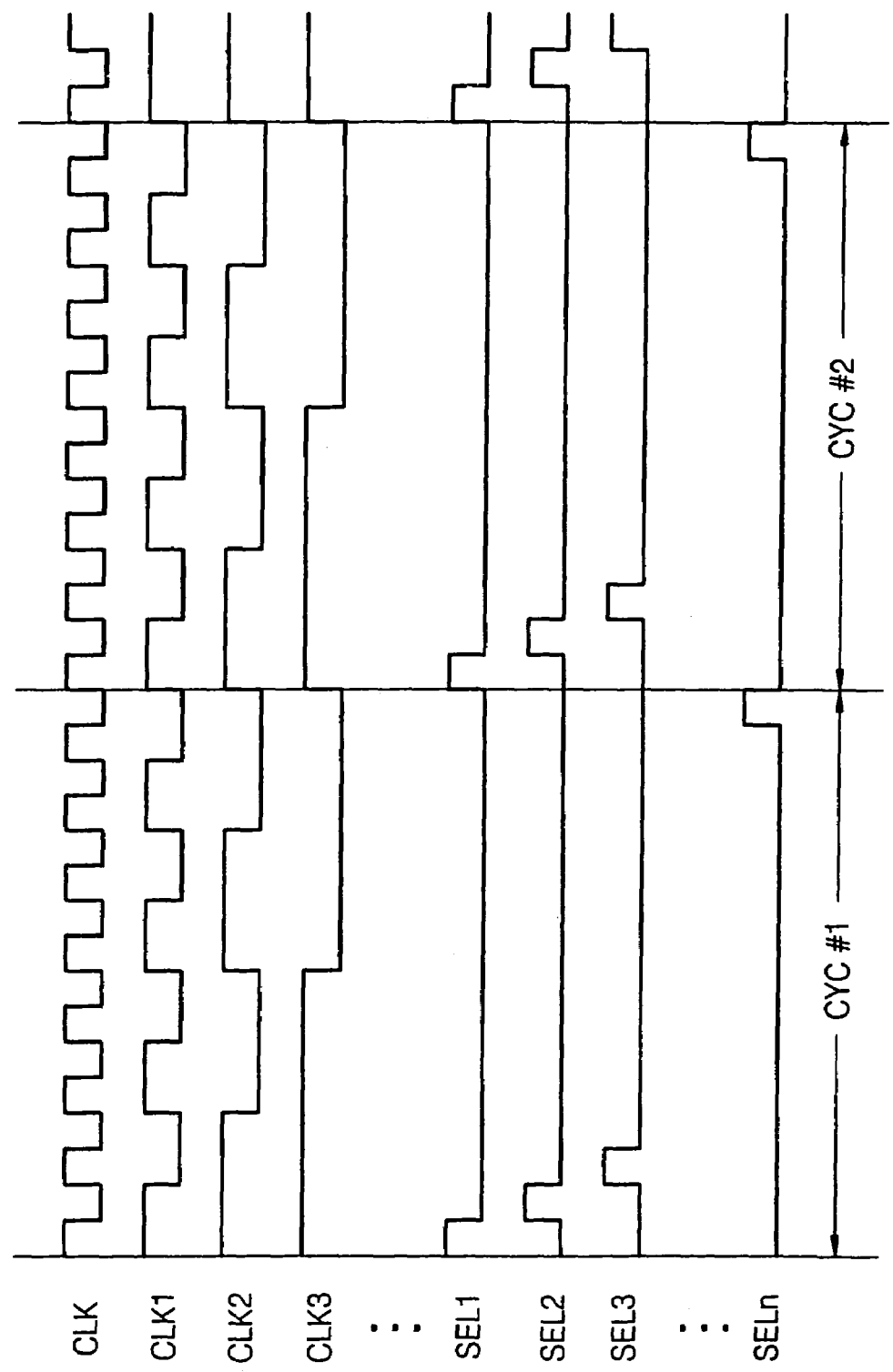
FIG. 2 illustrates a first example of the internal clock signals CLK1, CLK2, . . . , CLKn generated by the clock generator of FIG. 1 and the timing at which the first through nth selection signals SEL1, SEL2, SEL3, . . . , and SELn are generated from the internal clock signals CLK1, CLK2, CLK3, . . . , and CLKn.

FIG. 2 illustrates a first example of the internal clock signals CLK1, CLK2, . . . , CLKn generated by clock generator 160 and the timing at which the first through nth selection signals SEL1, SEL2, SEL3, . . . , and SELn are generated from the internal clock signals CLK1, CLK2, CLK3, . . . , and CLKn. Because the logic circuitry to generate the selection signals from the internal clock signals is readily apparent from the waveforms illustrated in FIG. 2, the logic circuits will not be illustrated in the first logic controlled gates MLG1, MLG2, . . . , MLGn or second logic controlled gates DMLG1, DMLG2, DMLGn for the sake of brevity.

Referring to FIG. 2, the external clock signal CLK is divided by 2 to generate the first internal clock signal CLK1, the external clock signal CLK is divided by 4 to generate the second internal clock signal CLK2, the external clock signal CLK is divided by 8 to generate the third internal clock signal CLK3, . . . , and the external clock signal CLK is divided by $2^n$ to generate the nth internal clock signal CLKn. The first through nth selection signals SEL1, SEL2, SEL3, . . . , and SELn are sequentially enabled as shown in FIG. 2 in accordance with the toggling order of the first through nth internal clock signals CLK1, CLK2, CLK3, . . . , and CLKn.

The sequential generation of the first through nth selection signals SEL1, SEL2, SEL3, . . . , and SELn is periodically repeated. That is, after the first through nth selection signals SEL1, SEL2, SEL3, . . . , and SELn are sequentially enabled for a first cycle CYC#1, first through nth selection signals SEL1, SEL2, SEL3, . . . , and SELn are sequentially enabled for a second cycle CYC#2. Thus, the first logic controlled gates MLG1, MLG2, . . . , MLGn that are connected to the ports Port 1, Port 2, . . . , Port n are sequentially enabled so that analog input signals input to the ports Port 1, Port 2, . . . , Port n can be sequentially sent to the analog-to-digital converter 130. And, the selection signals SEL1, SEL2, . . . , SELn also sequentially enable the second logic controlled gates DMLG1, DMLG2, . . . , DMLGn so that the output from the analog-to-digital converter 130 is sequentially sent to the registers Register 1, Register 2, . . . Register n.

Figure 3:
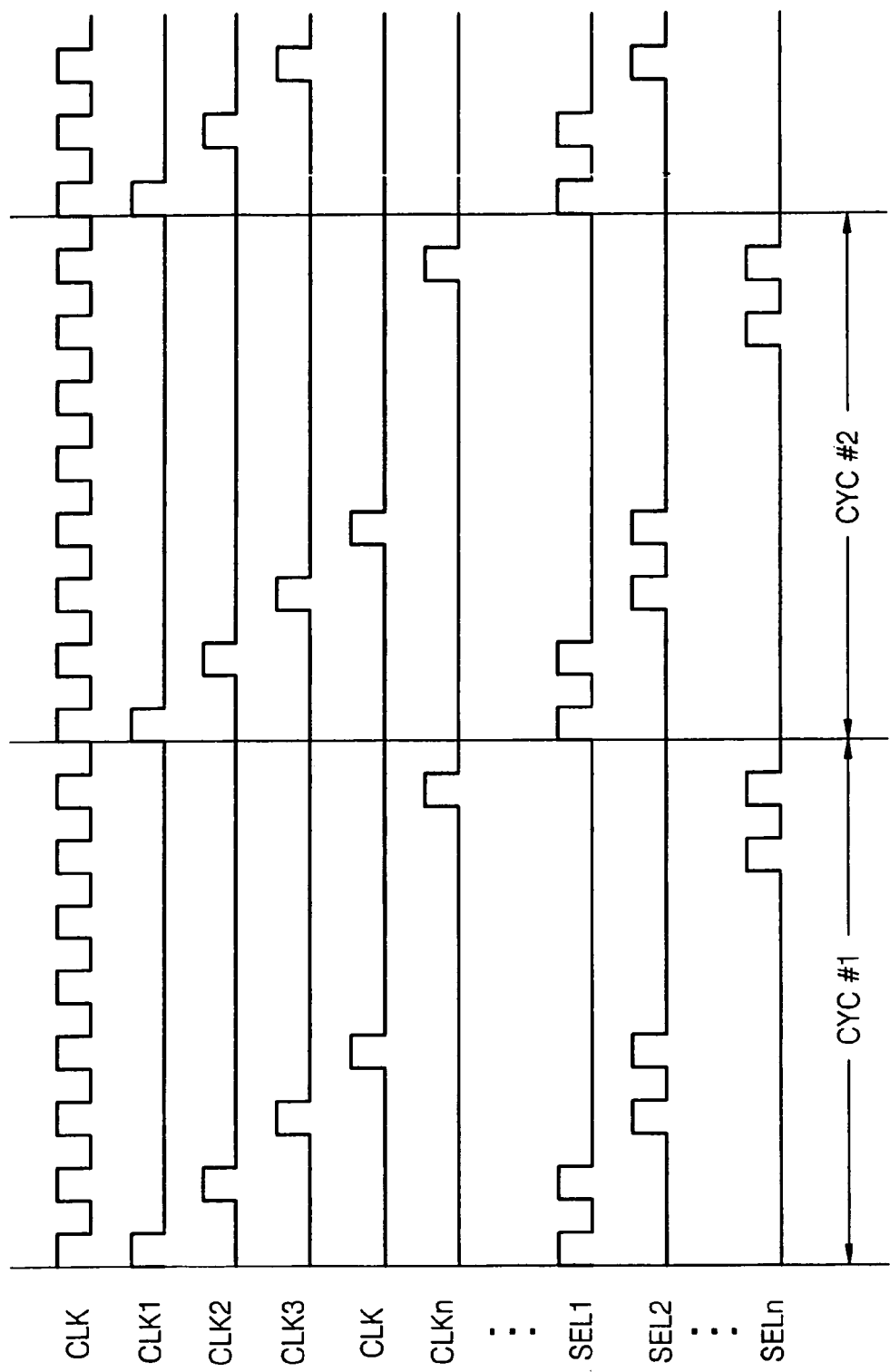
FIG. 3 illustrates a second example of the internal clock signals CLK1, CLK2, . . . , CLKn generated by the clock generator of FIG. 1, and the timings at which the first through nth selections signals SEL1, SEL2, . . . , SELn are generated from the internal clock signals CLK1, CLK2, . . . , CLKn.

FIG. 3 illustrates a second example of the internal clock signals CLK1, CLK2, . . . , CLKn generated by the clock generator 160, and the timings at which the first through nth selections signals SEL1, SEL2, . . . , SELn are generated from the internal clock signals CLK1, CLK2, . . . , CLKn. Because the logic circuitry to generate the selection signals from the internal clock signals is readily apparent from the waveforms illustrated in FIG. 3, the logic circuits will not be illustrated in the first logic controlled gates MLG1, MLG2, MLGn or second logic controlled gates DMLG1, DMLG2, . . . , DMLGn for the sake of brevity. As shown, the external clock signal CLK is gated in a well-known manner to generate the first through nth internal clock signals CLK1, CLK2, CLK3, . . . , and CLKn. By logically combining the internal clock signals CLK1, CLK2, CLK3, . . . , and CLKn, the first through nth selection signals SEL1, SEL2, SEL3, . . . , and SELn are enabled. That is, the first selection signal SELL is enabled in a period in which the first internal clock signal CLK1 and the second internal clock signal CLK2 are generated, the second selection signal SEL2 is enabled in a period in which the third internal clock signal CLK3 and the fourth internal clock signal CLK4 are generated, and the nth selection signal SELn is enabled in a period in which the n−1th internal clock signal CLKn−1 and the nth internal clock signal CLKn are generated.

The sequential generation of the first through nth selection signals SEL1, SEL2, SEL3, . . . , and SELn is periodically repeated. That is, after the first through nth selection signals SEL1, SEL2, SEL3, . . . , and SELn are sequentially enabled for a first cycle CYC#1, first through nth selection signals SEL1, SEL2, SEL3, . . . , and SELn are sequentially enabled for a second cycle CYC#2. Thus, the first logic controlled gates MLG1, MLG2, . . . , MLGn that are connected to the ports Port 1, Port 2, . . . , Port n are sequentially enabled so that analog input signals input to the ports Port 1, Port 2, . . . , Port n can be sequentially sent to the analog-to-digital converter 130. And, the selection signals SEL1, SEL2, . . . , SELn also sequentially enable the second logic controlled gates DMLG1, DMLG2, . . . , DMLGn so that the output from the analog-to-digital converter 130 is sequentially sent to the registers Register 1, Register 2, . . . Register n.

However, it will we appreciated that because the selection signals have two pulses, the analog signal is sent twice to the analog-to-digital converter 130 and output twice from the analog-to-digital converter 130 to a register Register 1, Register 2, . . . Register n. This provides a greater certainty of transmission through the analog-to-digital converter 130. Accordingly, it will be appreciated that single pulse selection signals may be generated instead.

The multi-port interfacing device 100 of the present invention includes a single analog-to-digital converter 130, which receives analog input signals via the plurality of ports Port 1, Port 2, . . . , Port n, selectively converts the analog input signals to digital output signals, and stores the digital output signals in the corresponding registers Register 1, Register 2, . . . Register n.

Figure 4:
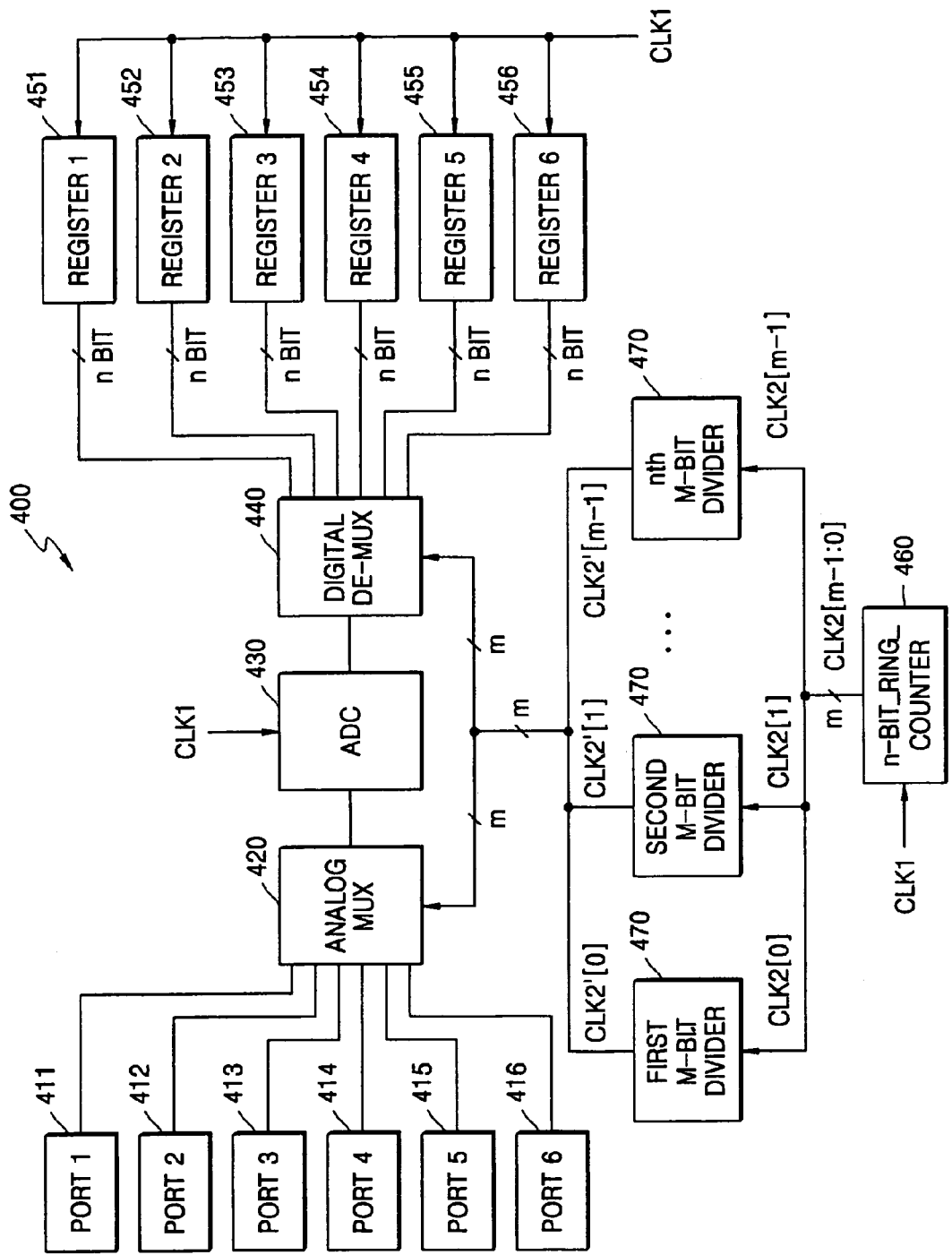
FIG. 4 illustrates a multi-port interfacing device according to a second embodiment of the present invention.

FIG. 4 illustrates a multi-port interfacing device according to a second embodiment of the present invention. Referring to FIG. 4, a multi-port interfacing device 400 includes ports 411–416, an analog MUX 420, an analog-to-digital converter 430, a digital de-MUX 440, registers 451-456, an n-bit ring counter 460, and m-bit dividers 471–473.

Analog input signals are input to the ports 411, 412, 413, 414, 415 and 416 and transmitted to the analog-to-digital converter 430 via the analog MUX 420. The analog MUX 420 selectively transmits the analog input signals input to the ports 411, 412, 413, 414, 415 and 416 to the analog-to-digital converter 430 in response to divided second clock signals CLK2'[0], CLK2'[1], . . . , and CLK2'[m−1].

The analog-to-digital converter 430 receives the analog input signals from the analog MUX 420 and converts them to digital output signals in response to a first clock signal CLK1. The digital de-MUX 440 receives the digital output signals from the analog-to-digital converter 430 and transmits the digital output signals to the respective registers 451, 452, 453, 454, 455 and 456 in response to the divided second clock signals CLK2'[0], CLK2'[1], . . . , and CLK2'[m−1].

The n-bit ring counter 460 receives the first clock signal CLK1 and generates second clock signals CLK2[0], CLK2 [1], . . . , and CLK2[m−1], which are the bits of an m-bit digital word.

First -(mth) m-bit dividers 470 divide the second clock signals CLK2[0], CLK2[1], . . . , and CLK2[m−1], without changing the pulse width, at cycles set by clock cycle setting registers (not shown) and generate the divided second clock signals CLK'2[0], CLK2'[1], . . . , and CLK2'[m−1] in a well-known manner as discussed in detail below with respect to FIG. 5.

Figure 5:
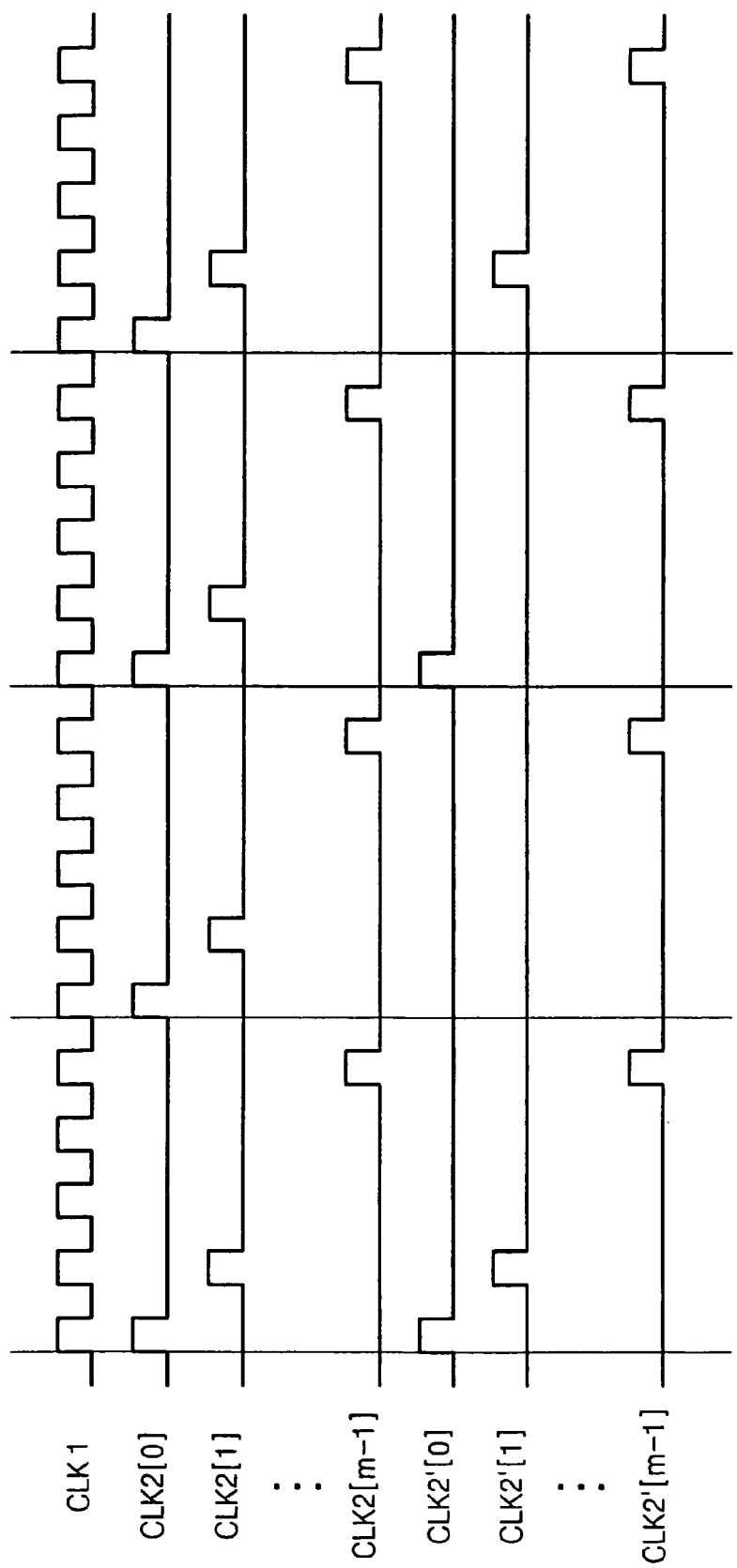
FIG. 5 shows timing diagrams of clock signals shown in FIG. 4.

FIG. 5 shows timing diagrams of the second clock signals CLK2[0], CLK2[1], . . . , and CLK2[m−1] and the divided second clock signals CLK2'[0], CLK2'[1], . . . , and CLK2' [m−1]. Referring to FIG. 5, the clock signal CLK2[0], the clock signal CLK2[1], . . . , and the clock signal CLK[m−1] are sequentially generated from the first clock signal CLK1. The clock signal CLK2[0] is divided by 2 to generate the clock signal CLK2'[0], and the clock signal CLK2[1] is divided by 3 to generate the clock signal CLK2'[1], etc., up through the clock signal CLK2 [m−2]. The clock signal CLK2[m−1] is divided by 1 to generate the clock signal CLK2'[m−1]. That is, a clock cycle obtained by dividing the clock signal CLK2[0] by 2 is set in the first m-bit divider 471, and a clock cycle obtained by dividing the clock signal CLK2[1] by 3 is set in the second m-bit divider 472, etc., up through the clock signal CLK2 [m−2] and a clock cycle obtained by dividing the clock signal CLK2[m−1] by 1 is set in the mth m-bit divider 473. As shown, the division referred to here lengthens the period of the resulting signal, but not the pulse width of the pulse in the resulting signal.

Therefore, the multi-channel interfacing device of the present embodiment converts analog input signals, which are input to the respective ports 411, 412, 413, 414, 415, and 416, to digital output signals according to clock cycles set in the respective first -(mth) m-bit dividers 470 and stores the digital output signals in the respective registers 451, 452, 453, 454, 455, and 456.

While this embodiment has been described using the example of six input port and six registers, it will be understood that the present invention is not limited to this number of input ports and registers.

Figure 6:
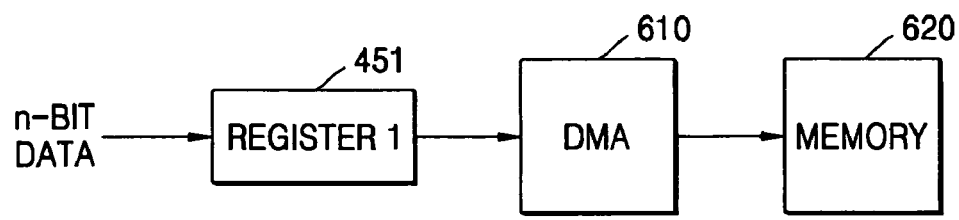
FIG. 6 illustrates a DMA and a memory that are connected to a first register shown in FIG. 4.

FIG. 6 is a conceptual diagram of the multi-channel interfacing device 400, in which data stored in the first register 451 of FIG. 4 is transmitted via a DMA 610 and stored in an allocated memory 620. Here, the first register 451 is exemplarily shown in FIG. 6, and thus it is obvious that data stored in the second through sixth registers 452, 453, 454, 455, and 456 may also be transmitted via the DMA 610 and stored in the allocated memory 620.

Figure 7:
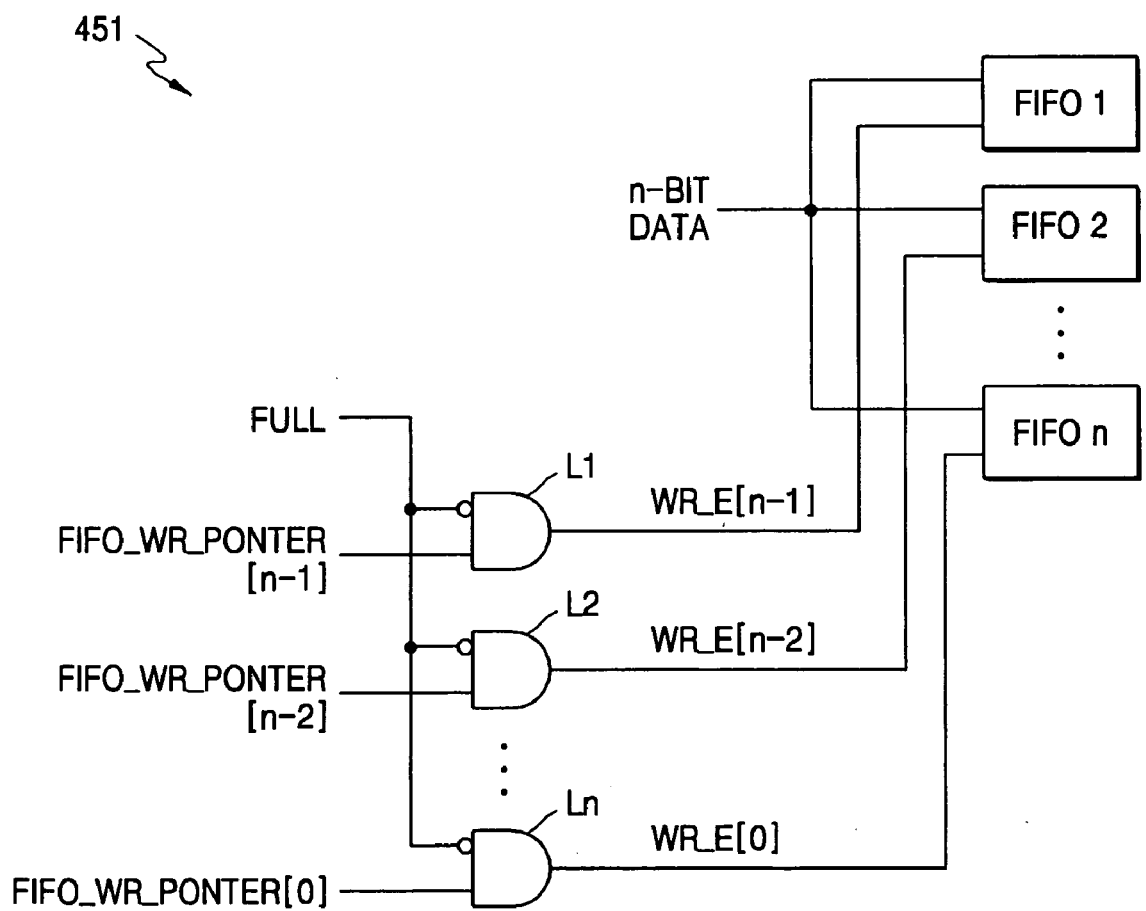
FIG. 7 illustrates the first register in FIG. 4 in detail.

FIG. 7 illustrates the first register 451 shown in FIG. 4 in detail. Referring to FIG. 7, the first register 451 includes n FIFO registers FIFO1, FIFO2, . . . , FIFOn, each of which stores digital data output from the analog-to-digital converter 430 of FIG. 4 in response to each of write enable signals WR_E[n−1:0]. The write enable signals WR_E[n−1:0] are generated from logic circuit units L1, L2, . . . , Ln in response to a full signal FULL and pointer signals FIFO_WR_POINTER[n−1:0] of the FIFO registers FIFO1, FIFO2, . . . , FIFOn.

The operation of the first register 451 will now be described. Initially, if digital data is stored in all the FIFO registers FIFO1, FIFO2, . . . , FIFOn, the full signal FULL is enabled to a logic high level and the write enable signals WR_E[n−1:0] are disabled to a low level. Thereafter, if a value stored in any one of the FIFO registers FIFO1, FIFO2, . . . , FIFOn is read and the FIFO register is emptied, the full signal FULL is disabled to a logic low level and the pointer signal FIFO_WR_POINTER[n−1:0] of the emptied FIFO register is enabled to a logic high level. When the pointer signal FIFO_WR_POINTER[n−1:0] of the emptied FIFO register is enabled to a logic high level, the write enable signal WR_E[n−1:0] of the emptied FIFO register is enabled to a logic high level. Thus, digital data processed in the analog-to-digital converter 430 of FIG. 4 is stored in one of the emptied FIFO registers FIFO1, FIFO2, . . . , FIFOn.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An analog-to-digital interfacing device, comprising:
an input selector receiving at least one analog signal and selectively outputting the at least one analog signal based on a plurality of clock signals;
an analog-to-digital converter converting the at least one analog signal output from the selector to at least one digital signal;
a plurality of registers; and
an output selector receiving each digital signal output from the analog-to-digital converter and selectively routing the digital signal to one of the plurality of registers based on the plurality of clock signals,
wherein the input selector includes at least one first logic controlled gate, each first logic controlled gate receiving one of the at least one analog signal and selectively outputting the received analog signal to the analog-to-digital converter based on the plurality of clock signals.

2. The device of claim 1, further comprising:
at least one port supplying the selector with the at least one analog signal.

3. The device of claim 2, wherein the selector outputs the at least one analog signal in sequence in response to the clock signals.

4. The device of claim 1, wherein the selector outputs the at least one analog signal in sequence in response to the clock signals.

5. The device of claim 4, further comprising:
a clock signal generator generating the plurality of clock signals.

6. The device of claim 5, wherein the clock signal generator divides an external clock signal by multiples of 2 to generate the plurality of clock signals.

7. The device of claim 5, wherein the clock signal generator gates pulses of an external clock signal to generate the plurality of clock signals.

8. The device of claim 5, wherein the plurality of clock signals are represented by a m-bit digital word.

9. The device of claim 1, wherein the plurality of clock signals are represented by a m-bit digital word.

10. The device of claim 1, wherein the output selector routes the digital signals to the plurality of registers in sequence.

11. The device of claim 1, wherein
the output selector includes a plurality of second logic controlled gates, each second logic controlled gate associated with one of the plurality of registers, each second logic controlled gate receiving the digital signal outputting from the analog-to-digital converter and selectively outputting the digital signal to the associated register based on the clock signals.

12. The device of claim 11, further comprising:
at least one port supplying the input selector with the at least one analog signal; and
wherein
each first logic controlled gate is associated with one of the plurality of input ports.

13. The device of claim 12, wherein the first and second logic controlled gates are sequentially enabled by the plurality of clock signals such that each port is associated with one of the registers and the digital signal generated from the analog signal output by the port is supplied to the associated register.

14. The device of claim 1, wherein each of the plurality of registers includes a number of first-in first-out (FIFO) registers.

15. The device of claim 1, further comprising:
a memory; and
a memory access controlling transferring digital information from one of the plurality of registers to the memory.

16. The device of claim 1, further comprising:
a clock signal generator generating the plurality of clock signals.

17. The device of claim 16, wherein the clock signal generator divides an external clock signal by multiples of 2 to generate the plurality of clock signals.

18. The device of claim 16, wherein the clock signal generator gates pulses of an external clock signal to generate the plurality of clock signals.

19. The device of claim 16, wherein the plurality of clock signals are represented by a m-bit digital word.

20. The device of claim 1, wherein the plurality of clock signals are represented by a m-bit digital word.

21. A method of analog-to-digital interfacing, comprising:
receiving at least one analog signal;
receiving a first clock signal;
generating a plurality of second clock signals based at least in part on the first clock signal, each of the plurality of second clock signals including at least one active state portion of the first clock signal;
selectively outputting one of the at least one analog signal based on the plurality of second clock signals;
converting the selected analog signal to a digital signal; and
selectively routing the digital signal to one of a plurality of registers based on the plurality of second clock signals.

22. The method of claim 21, wherein the active state portions of the plurality of second clock signals do not overlap.

* * * * *